United States Patent [19]

Bevans

[11] Patent Number: 4,583,005
[45] Date of Patent: Apr. 15, 1986

[54] SOLID STATE SWITCH ASSEMBLY

[75] Inventor: Leslie L. Bevans, Roscoe, Ill.

[73] Assignee: Sundstrand Corporation, Rockford, Ill.

[21] Appl. No.: 633,646

[22] Filed: Jul. 23, 1984

[51] Int. Cl.$^4$ .............................................. H02K 11/00
[52] U.S. Cl. .................................. 307/115; 310/68 D; 363/145; 307/140; 361/385
[58] Field of Search ............... 307/113, 115, 125, 126, 307/140; 373/144, 145; 310/68 R, 68 D; 357/75, 76, 82; 361/382, 385

[56] References Cited

U.S. PATENT DOCUMENTS

| | | | |
|---|---|---|---|
| 3,160,771 | 12/1964 | Martin et al. | 310/68 |
| 3,470,405 | 9/1969 | Andersson et al. | 310/68 |
| 3,471,757 | 10/1969 | Sias | 361/385 X |
| 3,474,358 | 10/1969 | Geddry et al. | 333/7 |
| 3,927,338 | 12/1975 | Vieilleribiere | 310/68 D |
| 3,999,105 | 12/1976 | Archey et al. | 361/385 |
| 4,224,663 | 9/1980 | Maiese et al. | 363/144 |
| 4,232,238 | 11/1980 | Saito et al. | 363/145 X |

Primary Examiner—A. D. Pellinen
Assistant Examiner—Derek S. Jennings
Attorney, Agent, or Firm—Wood, Dalton, Phillips, Mason & Rowe

[57] ABSTRACT

A solid state switch assembly including a circular array of three electrode semiconductors (26) with a control semiconductor (46) disposed centrally of the array. First and second buses (12 and 30) are in electrical contact with the semiconductors (26). A spider-like conductor (60) has legs (62) extending to respective control electrodes of the semiconductors (26) in the circular array and a central base (64) in circuit with the control semiconductor (46).

9 Claims, 7 Drawing Figures

4,583,005

SOLID STATE SWITCH ASSEMBLY

FIELD OF THE INVENTION

This invention relates to an assembly of semiconductors, and more particularly, to a solid state switch assembly utilizing semiconductors which may be utilized as a switch in high power systems.

BACKGROUND OF THE INVENTION

Prior art of possible relevance includes the following U.S. Pat. Nos. Martin 3,160,771; Vieilleribiere 3,927,338; Andersson 3,470,405; Maiese 4,224,663; Scharli 3,366,171; and Geddry 3,474,358.

Current, voltage and frequency limitations of switch assemblies formed of arrays of semiconductors are determined by the assembly's ability to maintain the operation of each individual semiconductor within its operating envelope. For example, where plural semiconductors are arranged in electrical parallel to operate as a switch, under high power loading, if the semiconductors are not turned on or off simultaneously, one or more of the semiconductors in the assembly may be momentarily, temporarily overloaded with the consequence that it may be damaged or fail during such momentary overload. This in turn will reduce the capacity of the assembly, possibly causing total failure the next time high loading is encountered due to such reduced capacity.

Another difficulty that may be encountered is stored energy in the system. When the semiconductors are turned off, such stored energy may be converted into a ringing signal which is damped oscillating high voltage spikes. Ultimately, the ringing signal converts to heat which can limit switch capacity, again giving rise to potential failure.

The present invention is directed to overcoming one or more of the above problems.

SUMMARY OF THE INVENTION

It is a principal object of the invention to provide a new and improved solid state switch assembly. More specifically, it is object of the invention to provide such a switch assembly wherein simultaneous changes of conductive states of the semiconductors making up the assembly is assured and wherein system capacity for stored energy is minimized.

An exemplary embodiment of the invention contemplates a solid state switch assembly including a circular array of three electrode semiconductor wafers, one electrode of each semiconductor being a control electrode. A control semiconductor is disposed in the center of the array and first and second buses sandwich the array and are in electrical contact with respect ones of the remaining electrodes. A conductor is disposed in the center of the array and extends to respective control electrodes of the semiconductors in the array and has a central portion in circuit with the control semiconductor.

As a consequence of this construction, the geometric size of the array is minimized to minimize its capacity for storing energy. At the same time, lead lengths to the control electrodes of the semiconductors are equalized through the use of the control semiconductor and the central conductor extending to the control electrodes and in circuit with the control semiconductor to thereby assure simultaneous change of conductive state of the semiconductors in the array.

A preferred embodiment of the invention contemplates a plurality of such arrays of semiconductors in superimposed but spaced relation. A plurality of the first and second buses sandwich the arrays in alternating fashion to thereby provide a stack.

In one form of the invention, there is provided a disc of insulating material between the buses. The disc has a series of apertures receiving the wafers to define the array.

According to the invention, at least one of the buses is a metallic ring-like structure having alternating steps. Each step is in contact with respective ones of the wafers and a plurality of heat exchangers are provided, one in each step oppositely of the associated wafer to thereby provide for dissipation of heat generated during operation of the assembly.

The invention also contemplates that where a stack of such arrays and buses is used, that the buses intermediate the ends of the stack each be metallic ring-like structures having such steps. Each wafer is in contact with either a step or a heat exchanger and coolant flow paths extend axially through the stack between the heat exchangers.

At one end of the stack, there is a combination bus, heat exchanger and housing and coolant distribution and return manifolds are disposed within such housing. Corresponding heat exchangers in the corresponding steps of each bus are in axial alignment with each other and each has aligned coolant inlet and outlet ports. The inlet and outlet ports are in fluid communication with the distribution manifold and the return manifold, respectively.

The insulating discs are additionally provided with a plurality of holes aligned with respective ones of the ports to define the axial flow paths for the coolant.

Other objects and advantages will become apparent from the following specification taken in connection with the accompanying drawings.

DESCRIPTION OF THE PREFERRED EMBODIMENT

Figure 1:
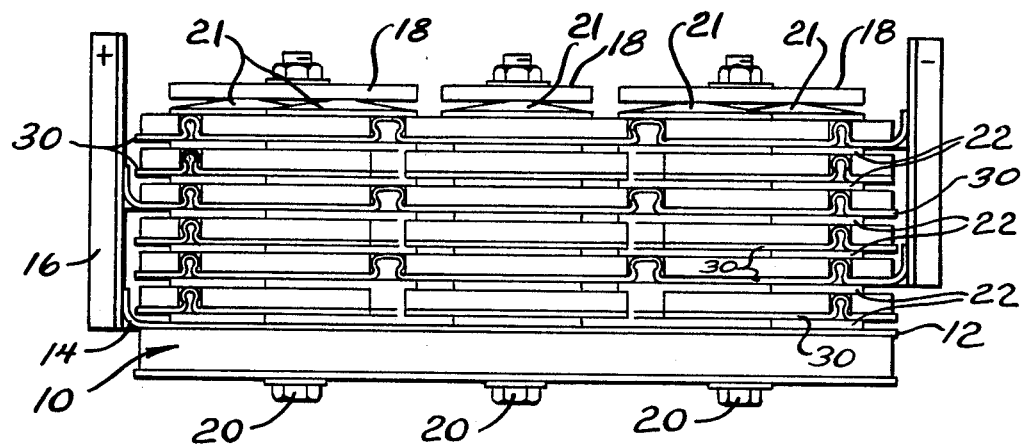
FIG. 1 is a side elevation of a solid state switch assembly made according to the invention.

An exemplary embodiment of a solid state switch assembly made according to the invention is illustrated in the drawings and with reference to FIG. 1 is seen to include a base, generally designated 10 which serves as a combination housing, bus and heat exchanger. The bus is formed by an upper conductive plate 12 which typically will be circular in configuration (See FIG. 3) with the exception of one radially outwardly extending tab 14 which may be soldered or otherwise connected to a conductor 16 (FIG. 1).

Figure 2:
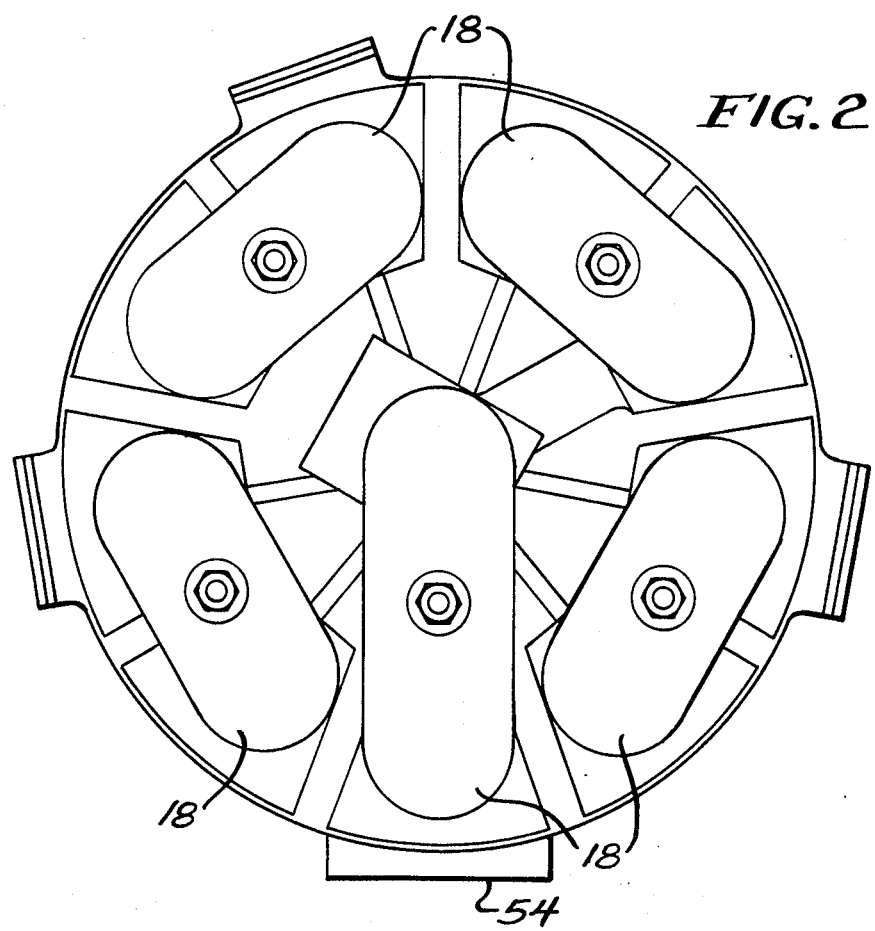
FIG. 2 is a plan view of the assembly.

As can be seen in FIG. 1, a plurality of components are stacked on the base 10 and more specifically are clamped thereagainst by clamping elements 18 drawn toward the base by tie bolts 20 extending through the assemblage. As best seen in FIG. 2, in the preferred embodiment, five of the clamps 18 are employed. The clamps act against the stack through discs 21 of insulating material. Preferably, the tie bolts 20 are formed of insulating material or extend through axial sleeves (not shown) in the stack and formed of insulating material.

Figures 3, 7:
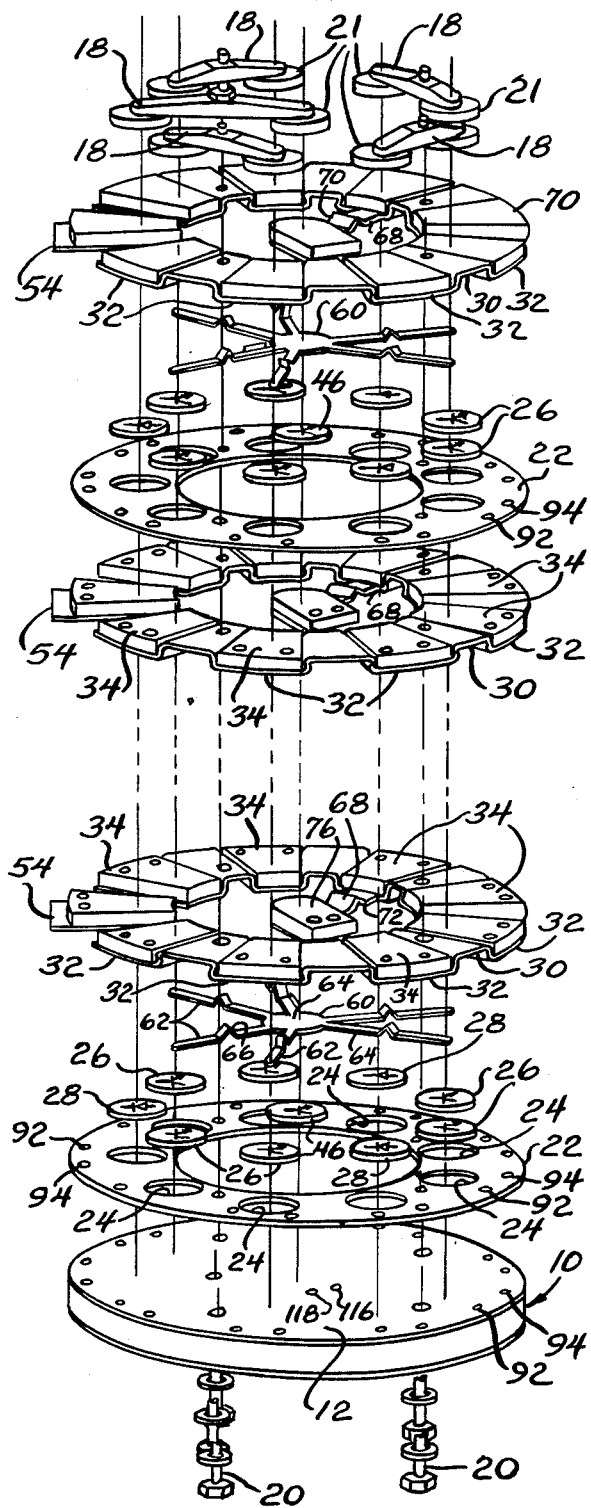
FIG. 3 is an exploded view of the assembly with certain components eliminated for clarity.
FIG. 7 is an electrical configuration of the preferred embodiment.

FIG. 3 illustrates, in exploded form, the various components disposed between the base 10 and the clamps 18. A number of ring-like discs 22, which may be identical each to the other and formed of insulating material are provided. Each of the discs 22 has a series of openings 24 which receive three electrode semiconductor wafers 26 and diode wafers 28 at the locations indicated. The wafers 26 and 28 are the usual solid state wafers lacking the customary packaging provided by the manufacturer thereof. As is well known, one face of each of the wafers 26 and 28 will form one electrode. In the case of the wafers 26, the opposite face will define two electrodes, one of which is a control electrode such as the base of a typical transistor. In the case of the wafers 28, the opposite face will form the other electrode of the diode.

It will be observed that the apertures 24 in the disc 22, when provided with the semiconductors 26 define a circular array of such semiconductors and that one electrode of each will be in electrical contact with the plate 12 which, it will be recalled, defines a bus.

The stack also includes a plurality of generally circular, corrugated buses 30. As can be seen in FIGS. 1 and 3, the buses 30 have a series of steps 32 as a result of the corrugations formed therein. Each of the steps 32 is provided with a heat exchanger 34 to be described in greater detail hereinafter. As can be appreciated from the lower portion of FIG. 3, each step 32 will be in electrical contact with the side of one of the wafers 26 or 28 opposite from the bus 12. The portion of such step making such contact is that side opposite the heat exchanger 34. At the same time, as can be appreciated from a consideration of the upper portion of FIG. 3, the wafers of certain of the arrays will be in electrical contact with the heat exchangers 34 on one side and with the steps 32 on the opposite side. To this end, the heat exchangers 34 are made of electrically conductive material so that they may serve electrically as part of their respective bus 30 in such cases.

Returning to FIG. 1, it will be appreciated that one form of the invention envisions the use of six of the buses having the configuration shown as element 30 and one of the buses having the configuration shown at 12. It will also be appreciated from FIGS. 1 and 3, that the buses are arranged in alternating fashion, that is, they alternate with the semiconductor arrays provided by the discs 22 with the consequence that all but the uppermost bus 30 and the bus 12 are common to two adjacent arrays of semiconductors.

Though no limitation, except as specified in the appended claims, is intended to a particular number of buses, in the form of the invention illustrated in FIG. 1, the assembly is intended for use as a three phase switch stack useful in providing three phase alternating current to a three phase motor based on a direct current input and an appropriate control signal. Thus, from top to bottom of the stack, the embodiment illustrated in FIG. 1 may be comprised of the following layers:

1. Clamps
2. Negative Battery Bus
3. Semiconductor Array
4. Motor Bus
5. Semiconductor Array
6. Positive Battery Bus
7. Semiconductor Array
8. Motor Bus
9. Semiconductor Array
10. Negative Battery Bus
11. Semiconductor Array
12. Motor Bus
13. Semiconductor Array
14. Positive Battery Bus and Base Thus, levels or layers 2-6 inclusive constitute the module for one phase of the three phrase output; layers 6-10, inclusive provide a second phase output; and layers 10-14 provide the third phase.

According to the preferred embodiment, each of the phases may be electrically configured as shown in FIG. 7 wherein a positive battery connection is designated 40, a negative battery connection designated 42 and the motor bus for one phase shown at 44. As can be seen, the semiconductors 26 in each array are connected in parallel between a motor bus 44 and one or the other of the battery buses 40 and 42. In addition, each array includes a control transistor 46 whose base 48 may receive a control signal. The control transistors 46 are Darlington connected to the control electrode or base of each of the semiconductors 26 in the associated array.

The diodes 28 may be located in the circuit as shown along with resistors 50 and capacitors 52. The diodes 28 are, of course, physically received between the buses while the resistors 50 and capacitors 52 may be suitably soldered as indicated to respective components on the exterior of the assembly through the use of tabs 54 on the buses 30 or elsewhere as required. The diodes 28, resistors 50 and capacitors 52 provide a circuit to eliminate voltage spikes that may occur during changes of the conductive state of the various semiconductor components as is well known.

Returning to FIG. 3, it can be seen that the control semiconductor 46 in each array is located centrally of the circular array of semiconductors 26 defined by each disc 22. A spider-like conductor 60 is disposed in the center of each array and has legs 62 extending radially outwardly from a central base 64 to be in contact with the control electrode of each of the semiconductors 26 in the associated array. For the connection illustrated in FIG. 7, the central base 64 of each spider-like conductor 60 will be in electrical contact with the emitter of the associated control semiconductor 46.

Because the control semiconductor 46 is centrally located in the circular array, it will be appreciated that the electrical pathes to the control electrodes of the semiconductors 26 will be of equal length along each of the legs 62. If desired, each of the legs 62 may be provided with a crimp 66 to accommodate thermal expansion during operation of the assembly.

It will also be seen in FIG. 3 that each of the buses 30 includes a radially inwardly directed tab 68 which in turn mounts a heat exchanger 70 in the center of the array. The heat exchanger 70 may be configured generally identical to the heat exchangers 34.

The tabs 68 may be provided with corrugations 72 intermediate their ends again to accommodate thermal expansion during operation. In this respect, the corrugations in the buses 30 likewise provide for the accommodation of thermal expansion.

The heat exchangers 34 and 70 serve as cooled heat sinks to dissipate heat generated in the assembly during its operation since, as is well known, semiconductors are variable resistors, and thus generate heat during conduction. Though not specifically illustrated herein each heat exchanger includes an interior, U-shaped flow path having the configurations illustrated in FIG. 4. More particularly, each of the heat exchangers 34 has an interior configuration such as is illustrated at 80 in FIG. 4 while the heat exchanger 70 has a configuration such as that shown at 82. At each end of the U-shaped configurations 80, there is provided an inlet port 86 and at the opposite end, an outlet port 88. In the case of all of the heat exchangers 34 and 70 save for those associated with the uppermost bus 30, identified as layer 2 previously, the ports 86 and 88 extend completely through the heat exchanger. In the case of the heat exchangers 34 and 70 associated with the layer 2 bus 30, such ports are located only in the bottom boundry of the respective heat exchanger.

All of the ports in a given axial row of heat exchangers are aligned with each other in the assembly and it will be seen in FIG. 3 that each of the insulating discs 22 includes holes or openings 92 and 94 alignable with the ports 86 and 88. O-ring seals (not shown) may be employed in each of the holes 92 and 94 and when the assemblies clamp together as shown in FIG. 1, it will be appreciated that a plurality of coolant flow paths extend axially of the stack between each of the heat exchangers in the assembly, with one coolant flow path serving as a supply conduit and the other serving as a return conduit.

Figure 4:
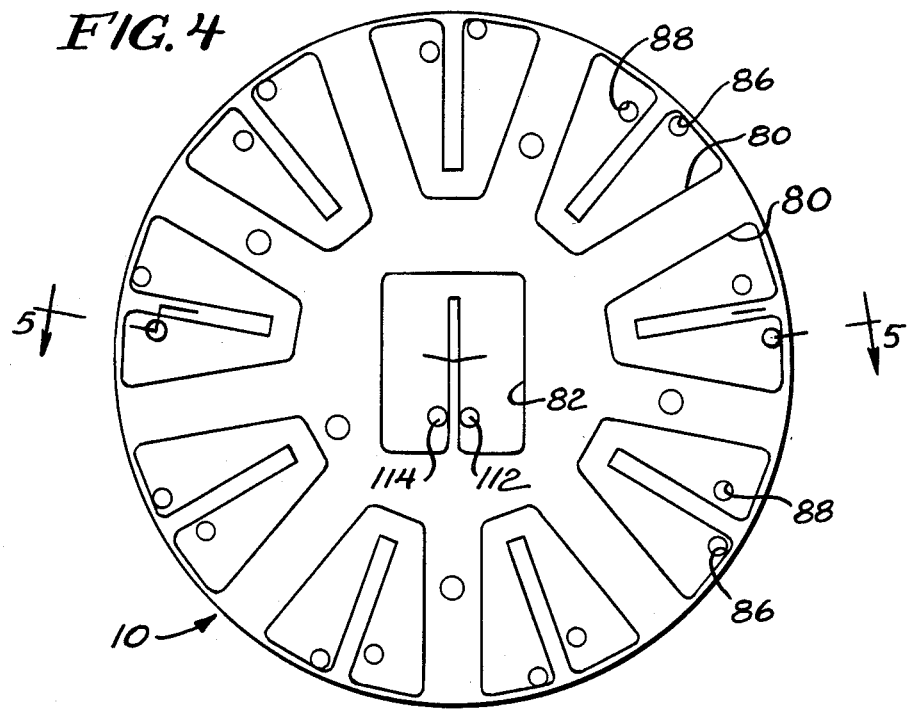
FIG. 4 is a plan view of a combination bus, housing and heat exchanger structure used at one end of the assembly.
Figure 5:
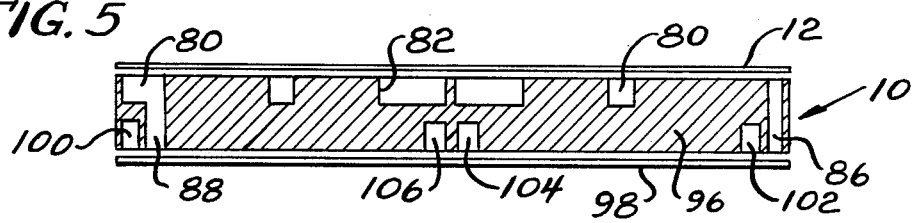
FIG. 5 is a sectional view taken approximately along the line 5—5 in FIG. 4.
Figure 6:
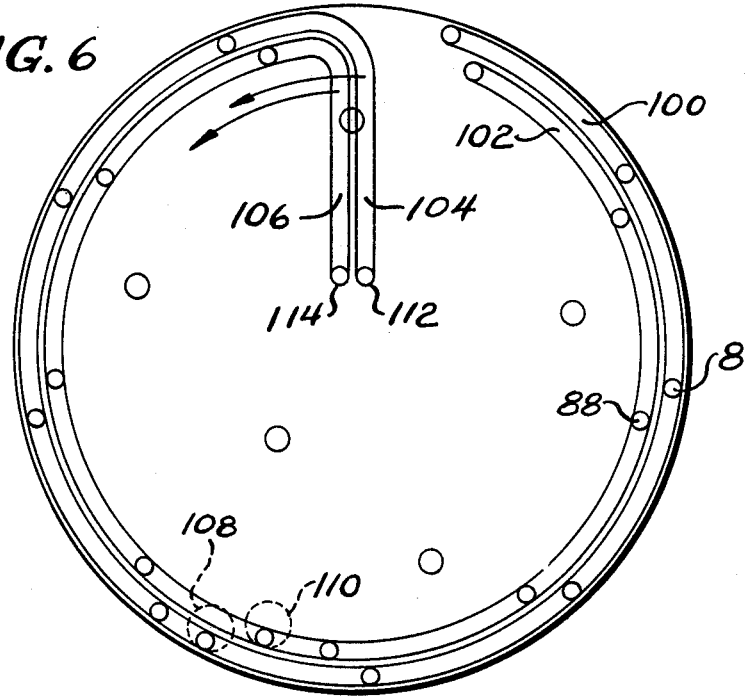
FIG. 6 illustrates a manifold structure forming part of the combination housing, bus and heat exchanger.

FIGS. 4-6 illustrate, in greater detail, the nature of the base 10. As mentioned previously, the same includes the upper plate 12, which serves as the fourteenth layer bus, an internal block 96 which defines a heat exchanger for the thirteenth layer wafers 26 and 28 and a lowermost closure plate 98.

The upper surface of the block 96 has the recesses shown at 80 and 82 in FIG. 4 disposed therein. Thus, a unitary heat exchanger structure providing the same function as all of the heat exchangers 34 and the heat exchangers 70 in one layer is provided.

As seen in FIG. 6, the lower side of the block 96 includes first and second, generally concentric channels 100 and 102 each of which has a radially inwardly directed end leg 104 and 106 respectively.

Suitable fittings, shown in dotted lines at 108 and 110 in FIG. 6 are formed in the closure plate 98 and are in fluid communication respectively with the channels 100 and 102. One of the channels 100 may serve as a distribution manifold for incoming coolant while the other may serve as a return manifold for returning coolant.

At the locations illustrated, the bores 86 and 88 extend from the channels 100 and 102 respectively to the U-shaped recesses 80. Similar ports 112 and 114 are associated with the channel legs 104 and 106 respectively to provide a coolant inlet and outlet path to the recess 82.

As seen in FIG. 3, the plate 12 is provided with openings 92 and 94 corresponding to the openings 92 and 94 in the insulating discs 22. Thus, the recesses 80 and 82 in the block 96 are in fluid communication via the apertures 92 and 94 in the plate 12 and the insulating discs 22 with the identically numbered ports in each of the heat exchangers 34. Ports 116 and 118 in the plate 10 provide for identical fluid communication between the recess 82 and the heat exchanger 70.

As a consequence of this construction, all of the heat exchangers in the assembly are effectively connected in parallel by axially extending flow paths extending between the distribution manifold 100, the various heat exchangers and the return manifold 102.

From the foregoing, it will be appreciated that a solid state switch assembly made according to the invention is ideally suited for use as a high power switch. The relatively compact nature of the assembly provided by grouping the semiconductors in a circular fashion about a central control semiconductor and stacking the same provides a construction with a minimal capability for storing energy thereby minimizing heat build-up problems associated with ringing. The use of individual heat exchangers on both sides of each semiconductor wafer provides excellent cooling so that electrical capacity of the system is maximized because heat build-up may be minimized. It will also be appreciated that the unique configuration of a circular array of semiconductors about a central, control semiconductor assures equal lead lengths for the control signal to individual semiconductors in the circular array. Consequently, the possibility that one or more semiconductors will change their conductive phase slightly before or after others in each array, causing possible overloading and damage to the assembly, is avoided. Thus, a long lived and reliable assembly is provided according to the invention.

I claim:

1. A solid state switch assembly comprising:
   a circular array of three electrode semiconductor wafers, one electrode of each semiconductor being a control electrode;
   a control semiconductor disposed in the center of said array;
   first and second buses sandwiching said array and being in electrical contact with respective ones of the remaining electrodes; and
   a spider-like conductor in the center of said array having legs extending to respective control electrodes of the semiconductors in said array and a central base in circuit with said control semiconductor.

2. The solid state switch assembly of claim 1 including a ring of insulating material between said buses, said ring having a series of apertures receiving said wafers.

3. The solid state switch assembly of claim 1 wherein one of said buses is a metallic ring-like structure having alternating steps, each step being in contact with a respective one of said wafers, and a plurality of heat exchangers, one in each step oppositely of the associated wafer.

4. A solid state switch assembly comprising:
   a plurality of superimposed, spaced circular arrays of three electrode semiconductor wafers, one electrode of each semiconductor being a control electrode;
   a control semiconductor disposed in the center of each said array;
   a plurality of first and second buses, sandwiching said arrays in alternating fashion and being in electrical contact with respective ones of the remaining electrodes; and
   a spider-like conductor in the center of each said array having legs extending to respective control electrodes of the semiconductors in the associated array and a central base in circuit with said control semiconductor in the associated array;

said arrays and buses forming a stack.

5. The solid state switch assembly of claim 4 wherein the buses intermediate the ends of said stack are each metallic ring-like structure having alternating steps, each step being in contact with a respective one of said wafers, and a plurality of heat exchangers, one in each step such that each wafer is in contact with either a step or a heat exchanger; and coolant flow paths extending axially through said stack between said heat exchangers.

6. The solid state switch assembly of claim 5 wherein one end of said stack comprises a combination bus and housing; coolant distribution and return manifolds within said housing; corresponding heat exchangers in the corresponding steps of each said bus being in axial alignment with each other and each having aligned coolant inlet and outlet ports, the inlet ports being in fluid communication with said distribution manifold and the outlet ports being in fluid communication with said return manifold.

7. The solid state switch assembly of claim 6 wherein said buses are separated by discs of insulating material, each disc having a series of apertures receiving the wafers of a corresponding one of said arrays and a plurality of holes aligned with respective ones of said ports to define said flow paths.

8. A solid state switch assembly comprising:

a circular array of three electrode semiconductor wafers, one electrode of each semiconductor being a control electrode;

a control semiconductor disposed in the center of said array;

first and second buses sandwiching said array and being in electrical contact with respective ones of the remaining electrodes; and a conductor in the center of said array extending to respective control electrodes of the semiconductors in said array and having a central portion in circuit with said control semiconductor.

9. The solid state switch assembly of claim 8 including a disc of insulating material between said buses, said disc having a series of apertures each receiving a respective one of said wafers.

* * * * *